(12) United States Patent
Levy et al.

(10) Patent No.: US 6,275,971 B1
(45) Date of Patent: *Aug. 14, 2001

(54) METHODS AND APPARATUS FOR DESIGN RULE CHECKING

(75) Inventors: Harold J. Levy, Cupertino; Subhas Bothra, San Jose; David C. Chapman, Santa Clara, all of CA (US)

(73) Assignee: Philips Electronics North America Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/941,898

(22) Filed: Sep. 30, 1997

(51) Int. Cl.$^7$ ........................................................ G06F 17/50
(52) U.S. Cl. ........................................................ 716/5; 716/11
(58) Field of Search .................................... 364/488, 489, 364/490, 491; 395/500, 500.11, 500.09, 500.06, 500.03, 500.12, 500.22, 500.2; 430/5; 716/5, 2, 8, 10, 11, 19, 21

(56) References Cited

U.S. PATENT DOCUMENTS

| 4,812,962 | 3/1989 | Witt | 364/490 |
|---|---|---|---|
| 5,408,538 * | 4/1995 | Kitakado et al. | 382/8 |
| 5,459,093 * | 10/1995 | Kuroda et al. | 437/51 |
| 5,475,766 | 12/1995 | Tsuchiya et al. | 382/144 |
| 5,546,225 * | 8/1996 | Shiraishi | 359/559 |
| 5,553,273 | 9/1996 | Liebmann | 395/500 |
| 5,620,916 * | 4/1997 | Eden et al. | 395/500.11 |
| 5,761,075 * | 6/1998 | Oi et al. | 364/488 |
| 5,795,683 * | 8/1998 | Uno et al. | 430/5 |
| 5,798,937 * | 8/1998 | Bracha et al. | 364/490 |
| 5,872,862 * | 2/1999 | Okubo et al. | 382/151 |

* cited by examiner

Primary Examiner—Matthew Smith
Assistant Examiner—Vuthe Siek
(74) Attorney, Agent, or Firm—Martine & Penilla, LLP

(57) ABSTRACT

Disclosed is a method for checking integrated circuit layout design files. The method includes identifying a via geometry that is laid out on a via mask file. Identifying a metallization geometry that is laid out on a metallization mask file. Shifting the via geometry in a first orientation to produce a first shifted via geometry. Performing a logical AND between the first shifted via geometry and the metallization geometry. The method further includes determining whether the logical AND produces a value indicative of a sufficient overlap between the identified metallization geometry and the first shifted via geometry.

22 Claims, 11 Drawing Sheets

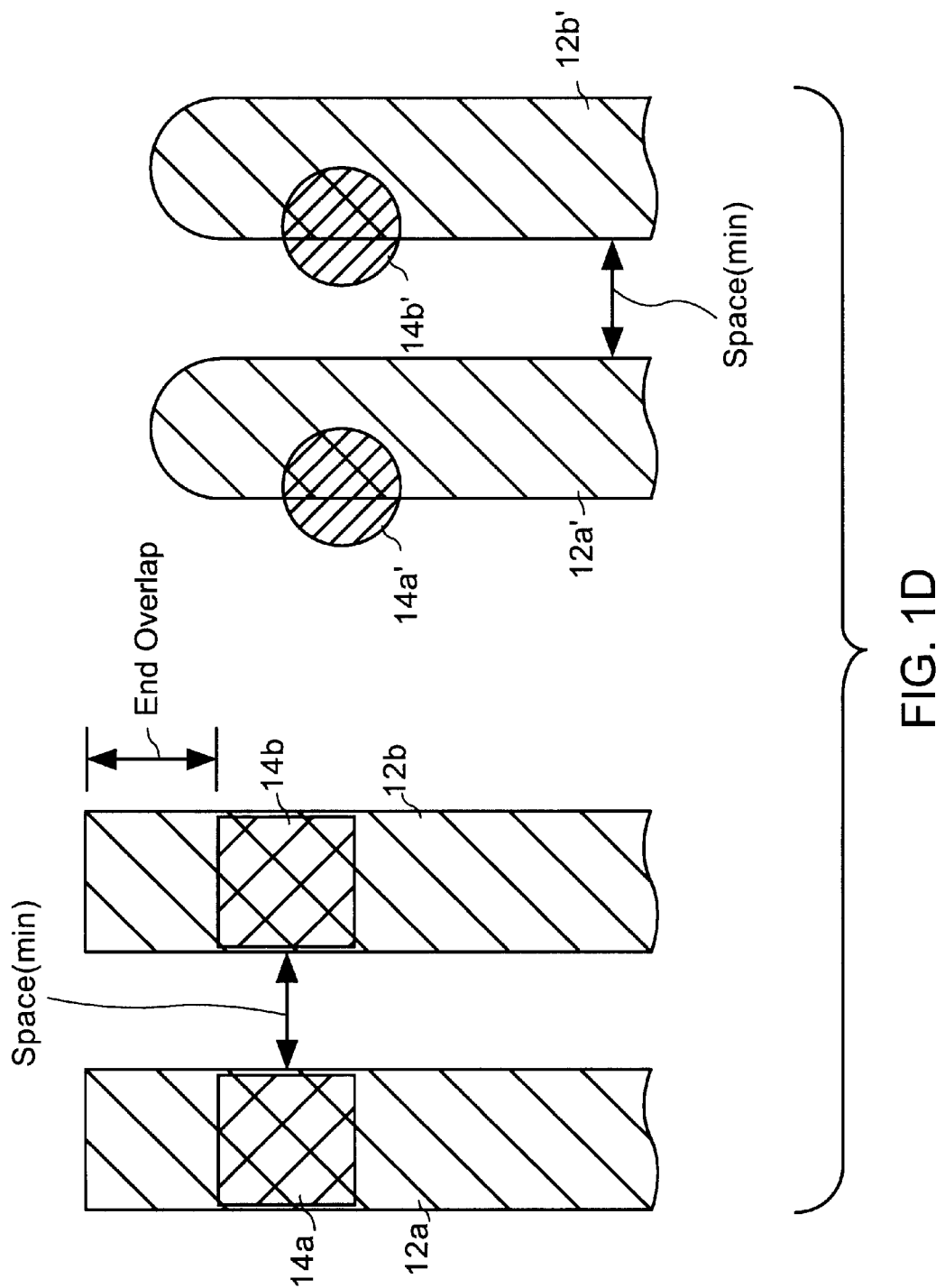

$12b^2 + 6bv$ $12b^2 + 9bv$ $8b^2 + 6bv + v^2$

METHODS AND APPARATUS FOR DESIGN RULE CHECKING

BACKGROUND OF THE INVENTION

1. Field of the Invention

The present invention relates generally to integrated circuits and, more particularly, to computer automated methods for checking integrated circuit layout masks.

2. Description of the Related Art

As the size of semiconductor device features continues to shrink and the demand for increased circuit density has correspondingly increased, semiconductor device designers have been turning to automated design tools, layout tools and checking tools. Because semiconductor devices are typically made by sequentially fabricating different device levels, a key task in designing a quality semiconductor device is to ensure that conductive vias used to interconnect a feature designed on a level below or a level above match up. Accordingly, because semiconductor devices have a very large number features, designers typically employ automated design rule checkers (DRCs) to verify that certain levels match up correctly. In general, before a layout design of a particular level is transferred onto a photolithography reticle, the design is in the form of a digital computer file, where each of the features have a plurality of associated X and Y coordinates that define their location on a mask.

To verify that successive levels match up, the DRC may perform logical comparisons between the coordinate mask layout files of each level to check whether a design rule has been violated. Exemplary design rules checking may include determinations of whether certain minimum inter-feature spacings have been violated, whether successive levels are overlapping, etc. Although DRCs are well suited to perform rapid checks over very large and complex layouts, current DRCs that check overlaps between a contact via level and an interconnect metal level require complete overlaps to avoid flagging an error. As such, designers typically design the interconnect metal line to be wider where a contact via will ultimately overlap. However, when interconnect metal lines are designed to be wider where contact vias overlap, the integrated circuit will necessarily be less dense, which thereby increases the size of a semiconductor chip.

With this in mind, FIG. 1A shows an upper level where metallization lines $12a$ and $12b$ are laid out, and a lower level where contact vias $14a$ and $14b$ are laid out. As shown, the metallization lines $12a$ and $12b$ have a Pitch$_1$, and each line has a width Lw. In this manner, the two lines $12a$ and $12b$ have a minimum spacing (i.e., space (min)) that must be satisfied when the DRC examines the level on which the metallization line features are designed. When these features are still in the form of computer files having associated X and Y coordinates, the contact vias $14a$ and $14b$ that are designed on the lower level will match up (and overlap exactly) with the metallization lines $12a$ and $12b$ that lie in the upper level. Unfortunately, when these computer file designs are transferred to a photolithography reticle, and are then transferred as physical features on a semiconductor wafer, misalignments between the levels will unfortunately occur.

FIG. 1B illustrates the possible misalignments that may occur between the metallizationinilfs $12a'$ and $12b'$ and the contact vias $14a'$ and $14b'$ when transferred to a wafer. As is well known in the art, when feature patterns are transferred to the wafer, features also typically undergo slight corner rounding 16, that may also tend to increase the gravity of a misalignment between successive levels. When this happens, the metallization lines $12a'$ and $12b'$ will not sufficiently overlap the contact vias $14a'$ and $14b'$, thereby causing an increased resistance "R" for current passing through the contact vias. By way of example, when the metallization lines $12a'$ and $12b'$ are completely overlapping the contact vias $14a'$ and $14b'$ (i.e., in cases of no misalignments), the resistance through the contact vias is at an optimum resistance for a given semiconductor design. However, when misalignments and rounding combine to produce scenarios such as those of FIG. 1B, the resistance through the contact vias may be unacceptably high, thereby reducing performance, and in some cases causing circuit failures.

To combat this problem, FIG. 1C shows the metallization lines $12a$ and $12b$ designed with an increased width around the contact vias $14a$ and $14b$. FIG. 1C is the computer file representation of the feature patterns before they are transferred to a wafer as described in FIG. 1B. As shown, the increased width is obtained by enlarging the size of the metallization lines by an overlap width (OLw) all the way around the contact vias $14a$ and $14b$. Nevertheless, to maintain appropriate minimums between features (i.e., to pass a minimum spacing DRC check), the metallization lines $12a$ and $12b$ must have a minimum spacing (i.e., space (min)). Accordingly, a Pitch that is greater than Pitch$_2$ must be satisfied between the metal lines, thereby causing a costly reduction in density throughout a device.

Because slightly higher resistance levels are becoming more acceptable in some technologies, designers have sought to increase circuit density by fabricating contacts with reduced overlap width. One way of achieving increased circuit density with reduced overlap width is to fabricate metallization lines that are just as thin as the contact vias and that extend beyond the vias as illustrated in FIG. 1D. When this is printed on the wafer, and a misalignment occurs, the resulting contact resistance is significantly less than that for the misalignment shown in FIG. 1B. This method also preserves the minimum metal pitch and thus allows a higher density layout than the technique used in FIG. 1C. Unfortunately, current DRC's do not allow the layout technique shown in FIG. 1D because the algorithms developed to check the FIG. 1C layout style are inadequate. By way of example, FIG. 1E illustrates a three step process that is currently performed by DRCs to ascertain whether to flag an error in a layout design. Initially, in an attempt to increase density, a designer may design the metallization line $12a$ to be just as thin as the underlying contact via $14a$. Next, the DRC will take the coordinate layout of the contact via $14a$ and perform a "bloat operation" that produces a bloat feature 30, that is an enlarged replica of the contact via $14a$. Once the bloat operation is performed, the DRC will perform a logical "AND" operation between the metallization line $12a$ (which contains the contact via $14a$), and the bloat feature 30 to produce an "AND" result 40. In this example, the AND result 40 is defined by the logical equation Bloat {Via} AND {Metal AND Via}.

In a following operation, that is pictorially illustrated in FIG. 1F, the DRC performs a compare operation between the bloat feature 30 and the AND result 40. If the area of the bloat feature 30 is greater than the AND result 40, the DRC will flag this as a fail. On the other hand, if the metallization line $12a$ had been enlarged as shown in FIG. 1C, the logical "AND" operation would have produced a geometry having the same area as the bloat feature 30. As such, if these areas are equal, no fail flag would be produced. As can be appreciated, the strict operators of current DRCs pose a troubling limitation on the design of integrated circuits that demand increased circuit layout density.

In view of the foregoing, what is needed is an automated method and apparatus for checking layout mask files with DRC algorithms that enable custom checking of minimum overlapping requirements between layout mask files of different levels.

SUMMARY OF THE INVENTION

Broadly speaking, the present invention fills these needs by providing methods an apparatus for checking possible misalignments between integrated circuit layout levels. Preferably, the methods and apparatus are well suited to be embodied in a computer design rule checker (DRC) that enables precision overlap tolerance detection. It should be appreciated that the present invention can be implemented in numerous ways, including as a process, an apparatus, a system, a device, a computer readable medium or a method. Several inventive embodiments of the present invention are described below.

In one embodiment, a method for checking integrated circuit layout design files is disclosed. The method includes identifying a via geometry that is laid out on a via mask file. Identifying a metallization geometry that is laid out on a metallization mask file. Shifting the via geometry in a first orientation to produce a first shifted via geometry. Performing a logical AND between the first shifted via geometry and the metallization geometry. The method further includes determining whether the logical AND produces a value indicative of a sufficient overlap between the identified metallization geometry and the first shifted via geometry.

In another embodiment, a method for checking overlap tolerance between layout mask files of different levels of a semiconductor integrated circuit device is disclosed. The method includes identifying a via pattern on a first layout mask file. Identifying a metallization pattern on a second layout mask file. The identified metallization pattern is at least partially overlapping the identified via pattern of the first layout mask file. The method further including bloating the identified via pattern to produce a bloated via pattern. Performing a logical AND between the bloated via pattern and the identified metallization pattern that does not include the via pattern to produce an AND geometry. Bloating the AND geometry to produce a bloated AND geometry having a result area; and determining whether the result area meets a pre-set minimum area.

In yet another embodiment, an apparatus for checking integrated circuit layout design files is disclosed. The apparatus includes means for identifying a via geometry that is laid out on a via mask file. Means for identifying a metallization geometry that is laid out on a metallization mask file. Means for shifting the via geometry in a first orientation to produce a first shifted via geometry. Means for performing a logical AND between the first shifted via geometry and the metallization geometry. The apparatus further including means for determining whether the logical AND produces a value indicative of a sufficient overlap between the identified metallization geometry and the first shifted via geometry.

In still another embodiment, a computer readable media containing program instructions for checking integrated circuit layout design files is disclosed. The computer readable media includes program instructions for identifying a via geometry that is laid out on a via mask file. Program instructions for identifying a metallization geometry that is laid out on a metallization mask file. Program instructions for shifting the via geometry in a first orientation to produce a first shifted via geometry. Program instructions for performing a logical AND between the first shifted via geometry and the metallization geometry. The computer readable media further includes program instructions for determining whether the logical AND produces a value indicative of a sufficient overlap between the identified metallization geometry and the first shifted via geometry.

Advantageously, it should be apparent to those skilled in the art of checking mask layouts that enabling a user to custom define a critical area for which to determine a pass or fail significantly reduces the amount of manual layout labor that goes into checking designs. As a result, each of the above described custom DRC software algorithms deliver a powerful solution that assists in significantly reducing the layout manufacturing cycle. This is especially true in view of modern integrated circuit designs that may have millions of vias and interconnect lines automatically designed using well known "place and route" software layout tools. The present invention also discloses a new DRC "shift" operator to assist in the automated DRC checking of minimum overlaps between layout features of one mask file and the layout features of another mask file. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

FIGS. 1A through 1F illustrate the limitations of several techniques used in checking for overlap errors.

DETAILED DESCRIPTION OF THE PREFERRED EMBODIMENTS

An invention for methods an apparatus for checking for possible misalignments between integrated circuit layout levels is disclosed. Preferably, the methods and apparatus are well suited to be embodied in a computer design rule checker (DRC). In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

A central component of the present invention is the implementation of a design rule checker (DRC) software program for analyzing layout design features that are characterized as coordinates in digital computer files. Therefore, the present invention is well suited to adapt the capabilities of a DRC program to quickly perform operations, such as bloating operations, logical AND operations, minimum area comparisons, etc. In still a further embodiment, a new DRC "shift" operator is disclosed to assist in the automated DRC checking of minimum overlaps between layout features of one mask file and the layout features of another mask file.

Figures 1A, 1B, 1C:
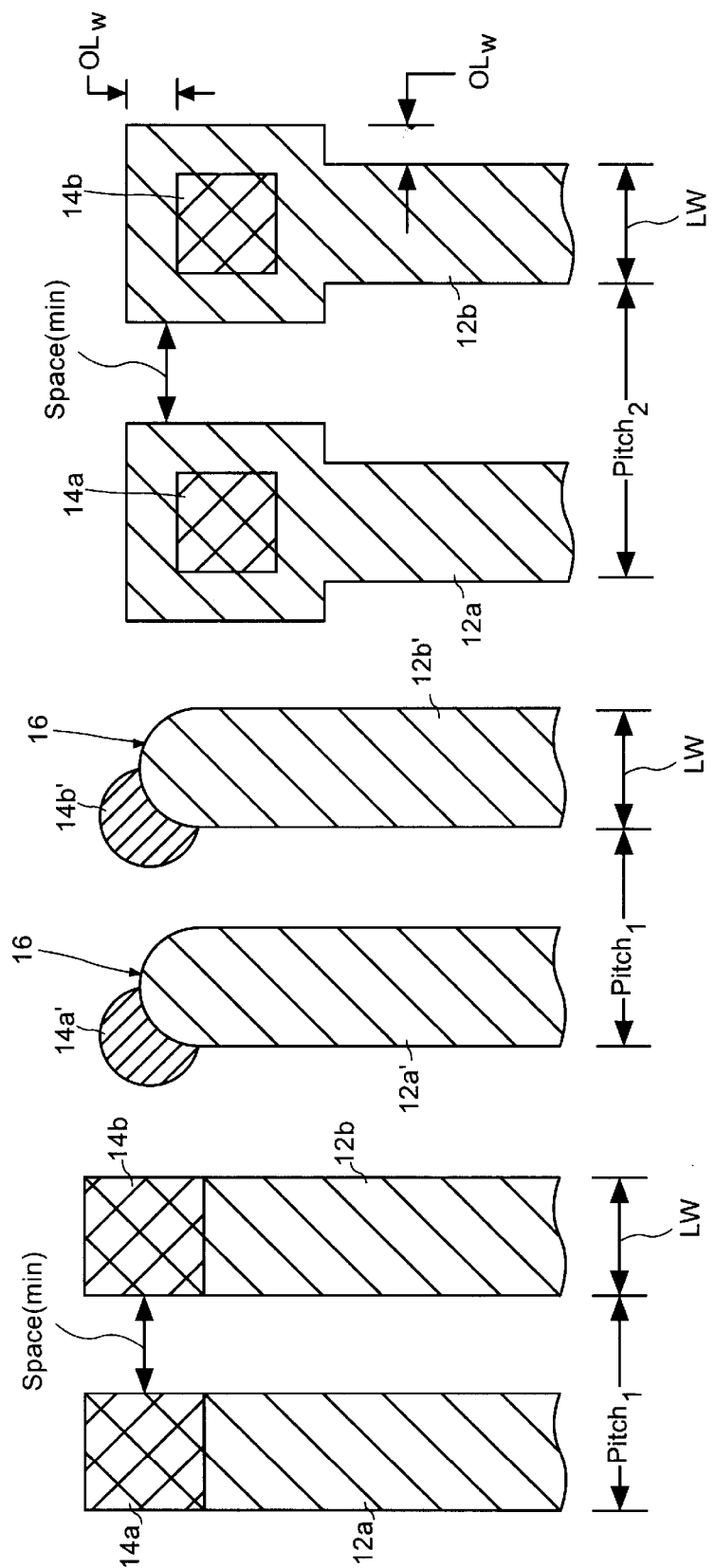
Figure 1E:
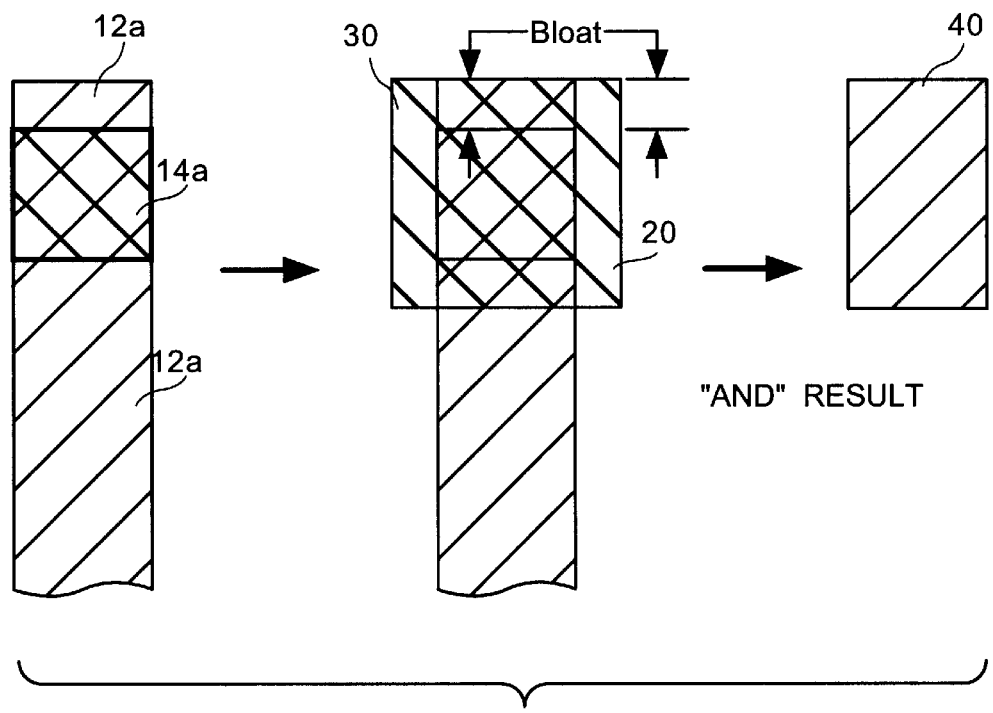
Figure 1F:
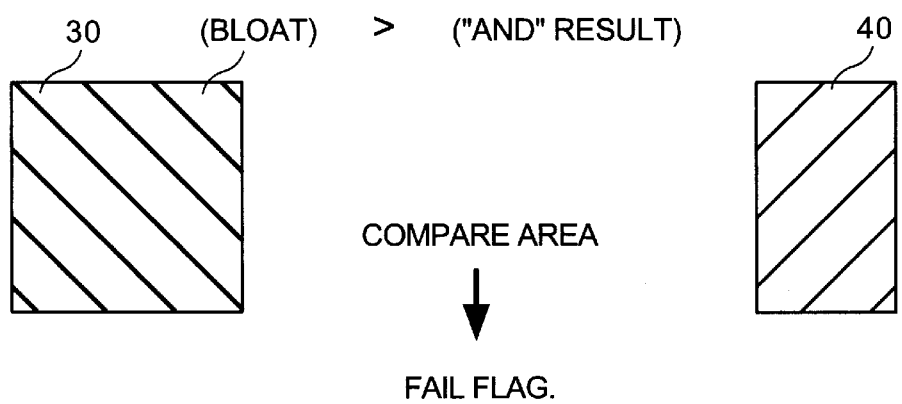
Figure 2:
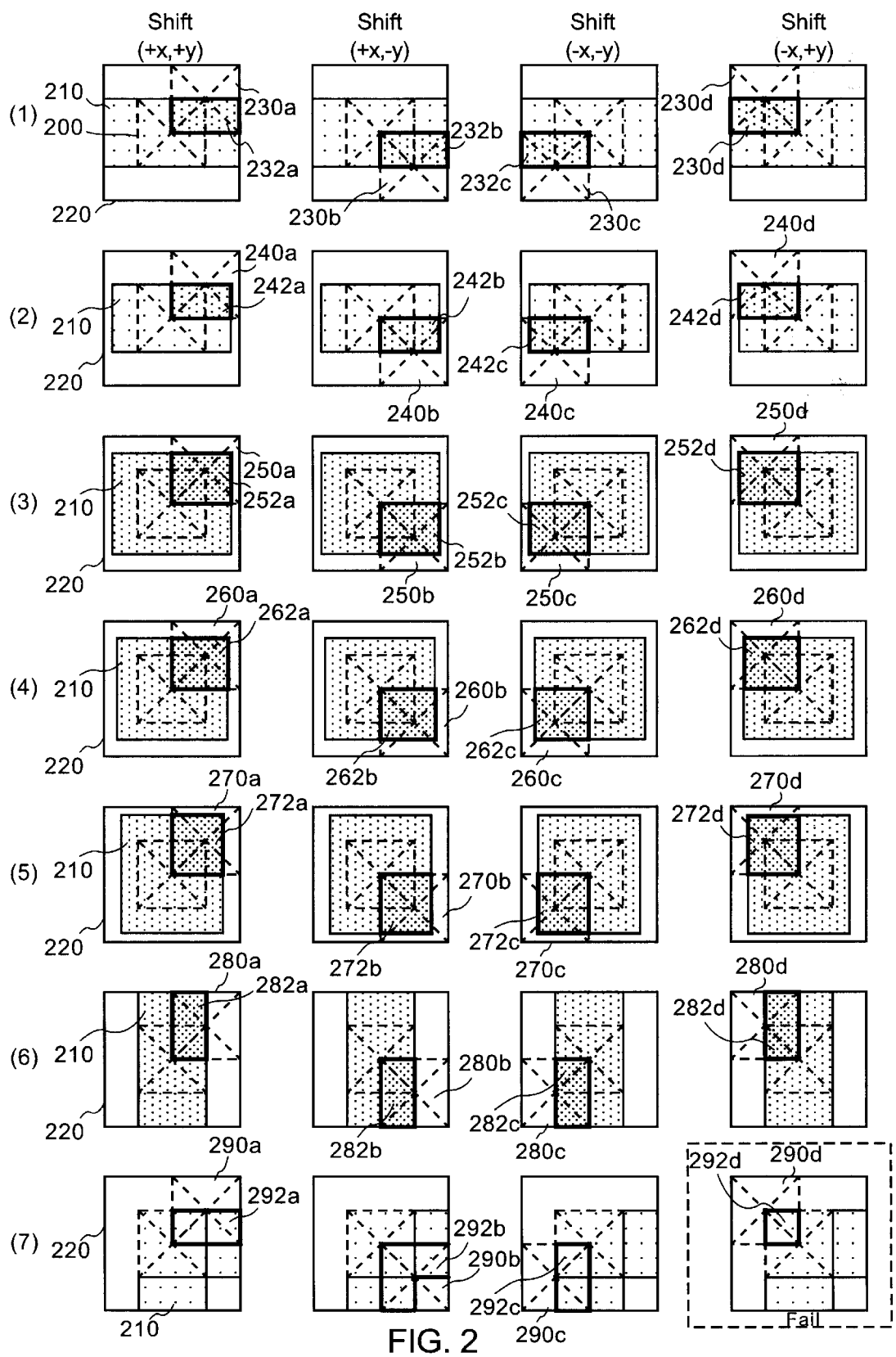
FIG. 2 is a diagrammatic representation of a plurality of shifting operations that are performed to produce different metallization overlapping geometries in accordance with one embodiment of the present invention.

FIG. 2 is a diagrammatic representation of a plurality of shifting operations that are performed to produce different metallization overlapping geometries in accordance with one embodiment of the present invention. In brief, each of the overlapping geometries represent possible misalignments that may occur when the via features from one mask level are misaligned with metallization features from another mask level. For ease of reference, each exemplary metallization geometry 210 shown in each row will be described with reference to four different shift operator scenarios, including a shift operator (+X, +Y) for column 1, a shift operator (+X, −Y) for column 2, a shift operator (−X, −Y) for column 3, and a shift operator (−X, +Y) for column 4. Accordingly, the shift operators are configured to shift the location of the vias to locations that simulate misalignments that may occur when the via mask and metallization masks are transferred to a silicon wafer.

Referring now to the first row, the metallization geometry 210 is shown as a metallization line that overlies an underlying via geometry 200. Operationally, a design rule checker (DRC) is designed to perform a bloat operation of the via geometry 200 to produce a bloat geometry 220 that expands the original coordinates of the via geometry outward by a predetermined amount. In one embodiment, the metallization geometry 210 may have a width that is selected depending on the micron technology being implemented to make an integrated circuit device. By way of example, if the micron technology is a 0.25 micron technology, the metallization geometry 210 may have a line width of about 0.4 microns, and therefore, the via geometry may be a 0.4 by 0.4 micron square.

In this example, the bloat geometry may extend the geometric coordinates of the via geometry 200 by about 2 microns to produce a bloat geometry having a 0.8 micron by 0.8 micron shape. However, the bloat geometry may be modified depending on a user's design specifications or on the design rule checking accuracy wanted. In addition, for other smaller or larger micron technologies, the line widths of the metallization geometry 200 may vary as will be illustrated in tables A through D below. In operation, the DRC is preferably well suited to perform a shift of the via geometry in a first orientation within the bloat geometry 220. As illustrated in the first column, the first shift operation preferably moves the via geometry to an upper right hand quadrant, thereby performing a shift in a +X and a +Y coordinate direction. In this manner, a shifted via geometry 230*a* is produced, and that shifted via geometry 230*a* is used in performing a logical "AND" with the metallization geometry 210.

The result of the logical AND operation produces an AND result 232*a*. Once the AND result 232*a* has been computed by the DRC, that result is examined to determine whether a sufficient overlap results when the metallization geometry 210 overlaps the shifted via geometry 230*a*. Preferably, by examining the amount of overlap, it is possible to determine the acceptable resistance that may be produced by a physical via structure when the misaligned masks (e.g., the shifted via geometry 230*a* and the metallization geometry 210) are transferred to the silicon wafer. In one embodiment, a passing overlap will preferably produce an AND result 232 that yields an overlap area of at least about 50% or more. In other words, the at least 50% overlap area is preferably well suited to produce a worst case resistance (e.g., the highest accepted resistance) in the event that the actual physical misalignment produces the offset simulated by the first exemplary shift operator. Of course, the at least about 50% approximate overlap applies to 0.25 micron technologies, 0.35 micron technologies or larger feature technologies. However, as will be illustrated by tables A–D below, the allowable overlap, which is directly related to the resulting resistance through the physical via structure, will tend to increase as the micron technologies shrink.

Once the DRC has performed the shift operation in the first column, the DRC will proceed and perform a second shift operation (+X, −Y) as illustrated in the second column of FIG. 2. In this shift operation, the shape of the via geometry 200 is shifted to the lower right quadrant of the bloat geometry 220 to produce a shifted via geometry 230*b*. Once shifted, and a logical AND operation is performed between the metallization geometry 210 and the shifted via geometry 230*b*, an AND result 232*b* is produced. In this example, the resulting AND result will produce an overlap area that is at least about 50% of the shifted via geometry 230*b*. Accordingly, if the resulting physical via is misaligned and ends up in the location of the shifted via geometry 230*b*, at least 50% of the resulting physical via will have an overlapping metallization line. In operation, if the overlap had not been at least 50%, the DRC would have recorded a failure as well as the location of the via so that a layout designer may correct the layout.

Moving to the third column of FIG. 2, the DRC will then perform a third shift operation using a shift operator (−X, −Y) to move the via geometry 200 to the lower left hand quadrant of the bloat geometry 220, thereby producing a shifted via geometry 230*c*. Now, a logical AND is performed between the metallization geometry 210 and the shifted via geometry 230*c* to produce an AND result 232*c*. As in the prior two examples, the overlap area resulting from the AND operation is at least 50% of the shifted via geometry 230*c*. Accordingly, if misalignments similar to the shifted via geometry 230*c* occur in the actual physical layout, there will be sufficient overlap, thereby avoiding an excessive resistance through the via structure.

The DRC then performs a final shift operation as illustrated in the fourth column of FIG. 2. This shift operation shifts the via geometry 200 to the top left hand quadrant of the bloat geometry 220, thereby producing a shifted via geometry 230*d*. The shifted via geometry 230*d* and the metallization geometry 210 are then subjected to a logical AND operation that produces an AND result 232*d*.

Once again, the AND result 232*d* is determined by the DRC to yield an overlap area that is at least 50% of the shifted via geometry 230*d*. As such, if the resulting physical via is misaligned to the point that it ends up in the location of the shifted via geometry 230*d*, the resistance experienced through the via structure would still be acceptable. Accordingly, the DRC will not mark an error after this shift operation.

The second row illustrates another exemplary metallization geometry 210, as well as the shifted via geometries 240a, 240b, 240c, and 240d that are performed by the shift operators of the DRC. In each one of the shift operations, the aforementioned logical AND operation is also performed between the shifted via geometries 240a–240d and the metallization geometries 210 to produce AND results 242a–242d. In each case, the AND results 242a–242d will have been determined by the DRC to have an overlap area that is at least 50% of the shifted via geometries 240a–240d.

The third row illustrates yet another example in which the DRC shift operation is performed to each quadrant of the bloat geometry 220 to produce shifted via geometries 250a–250d. The DRC also performs the logical AND operation between the shifted via geometries 250a–250d to produce AND result 252a–252d. In each of these examples, the DRC will also determine that at least about 50% overlap area is produced between the metallization geometries 210 and the shifted via geometries 250a–250b.

In rows 4 through 6, the DRC will again perform the shift operations to each for the four quadrants within the bloat geometries 220. For completeness, in row 4, the shifted via geometries are illustrated as 260a–260d, in row 5, the shifted via geometries are illustrated as 270a–270d, in row 6, the shifted via geometries are shown as 280a–280d, and in row 7, the shifted via geometries are shown as 290a–290d. In rows 4 through 6, after the DRC has computed the logical AND operation between the metallization geometries 210 and the shifted via geometries, the overlap area produced by the AND results 262a–262d, 272a–272d, 282a–282d, and 292a–292c are all determined by the DRC to have at least a 50% overlap area. That is, the overlap area of the metallization geometries 210 and the shifted via geometries is at least 50%, thereby yielding an acceptable resistance if the actual physical device experiences such misalignments.

However, in row 7, the shift operation performed in the fourth column results in a shifted via geometry 290d (i.e., a shift to the upper left hand quadrant of the boat geometry 220), and when the logical AND operation is performed between the metallization geometry 210 and the shifted via geometry 290d, an AND result 292d is produced. In this case, the metallization geometry 210 is a corner feature, and the AND result 292d generates an overlap area that is less than 50% of the shifted via geometry 290b. As a result, the DRC will flag this feature as a fail, and then login an error number and an X-Y coordinate for this failure. In this manner, a layout designer may correct the layout masks to avoid having an unacceptable resistance should a misalignment consistent with the shifted via geometry 290d occur.

Figure 3:
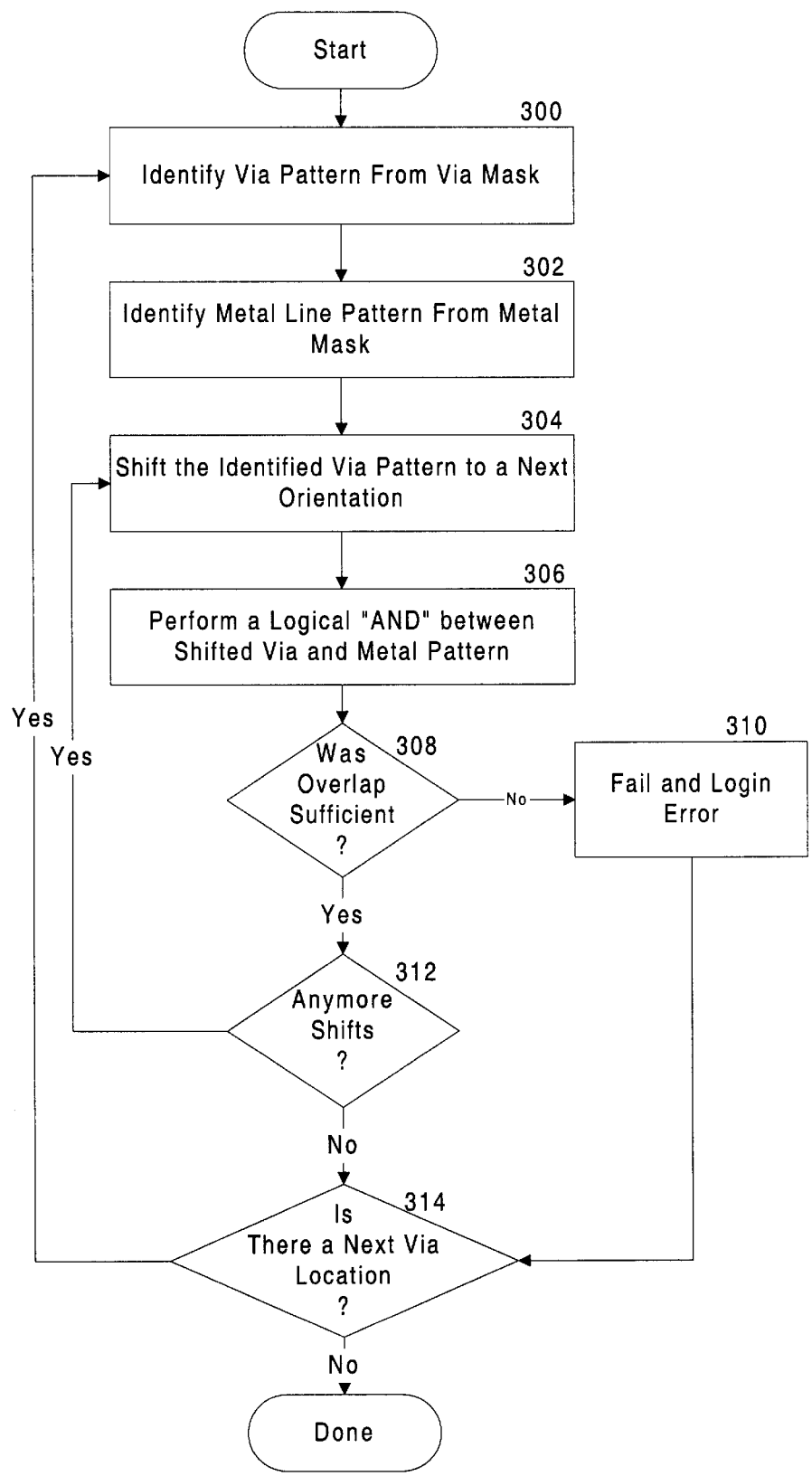
FIG. 3 is a flowchart diagram illustrating the method operations associated with checking for pass or failures in the overlaps between different levels of layout features of an integrated circuit design in accordance with one embodiment of the present invention.

FIG. 3 is a flowchart diagram illustrating the method operations associated with checking for pass or failures in the overlaps between different levels of layout features of an integrated circuit design in accordance with one embodiment of the present invention. The method begins at an operation 300 where a design rule checker (DRC) identifies a via pattern from a via mask. Once a via pattern has been identified in operation 300, the method proceeds to an operation 302 where a metal pattern associated with the identified via pattern is identified from a metal mask.

The method then proceeds to an operation 304 where the identified via pattern is shifted to a next orientation. As described in FIG. 2, a shift operator is preferably implemented as a new operator in a DRC software tool, such that the identified via pattern (i.e., the via geometries 200 of FIG. 2) are shifted to orientations (+X, +Y), (+X, -Y), (-X, -Y), and (-X, +Y) about a bloat geometry. In operation 304 however, the via pattern is initially shifted in a first orientation (i.e., +X, +Y). The method then proceeds to an operation 306 where a logical "AND" operation is performed between the shifted via pattern and the metal pattern to produce an AND result. The AND result will therefore yield an overlap area that is compared to the area of the identified via pattern.

Once the overlap area has been ascertained in operation 306, the method proceeds to a decision operation 308 where it is determined whether the overlap area is sufficient. By way of example, the overlap is sufficient if there is at least 50% overlap area of the identified metal line pattern over the shifted identified via pattern. In this manner, the resistance experienced by current passing through a resulting physical via generated by the masks on a silicon wafer will not be too high, and thereby hamper the performance of an integrated circuit design. As will be described below, the at least 50% overlap area is a general approximate number that may be well suited to work in the 0.35 micron technology, and the 0.25 micron technology ranges.

However, a 0.18 micron technology may require an overlap area of at least about 60%, a 0.15 micron technology may require an overlap area of at least about 75%, and a 0.13 micron technology may require an overlap area of at least about 80%. If it is determined in decision operation 308 that the overlap was not sufficient, the method will proceed to an operation 310 where a fail is recorded and logged-in to identify the via for which insufficient overlap will likely occur in the event of a misalignment. In one embodiment, the rule type that is violated is recorded as well as the location on the layout to enable a layout designer to modify the layout design in case such a misalignment occurs in the physical device (e.g., when the masks are transferred to a wafer).

On the other hand, if it is determined in decision operation 308 that the overlap area was sufficient, the method will proceed to a decision operation 312 where it is determined whether there are anymore shifts remaining around the bolt geometry. By way of example, in operation 304, the initial shift is preferably performed to the (+X, +Y) orientation, and the next shift may be performed to the (+X, -Y) orientation. Therefore, if all four orientations have not yet been performed, the method will proceed back to operation 304 where the via pattern is again shifted to a next orientation. The method will again proceed through the aforementioned operations until it is again determined in operation 312 whether anymore shifts remains. Of course, if a fail occurs during any one of the shift operations, that via will be marked as a failure irrespective of whether the other shift operations yielded passing marks.

If all shifts have been completed, then the method will proceed to a decision operation 314 where it is determined whether there is a next via location that should be checked by the DRC in accordance with the present invention. If there are other via locations, the method will proceed to operation 300 where the via pattern is identified from the via mask. Again, the method will march through the aforementioned operations until it is again determined in operation 314 whether there is a next via location. When there are no more via locations, the method will be done.

Figure 4:
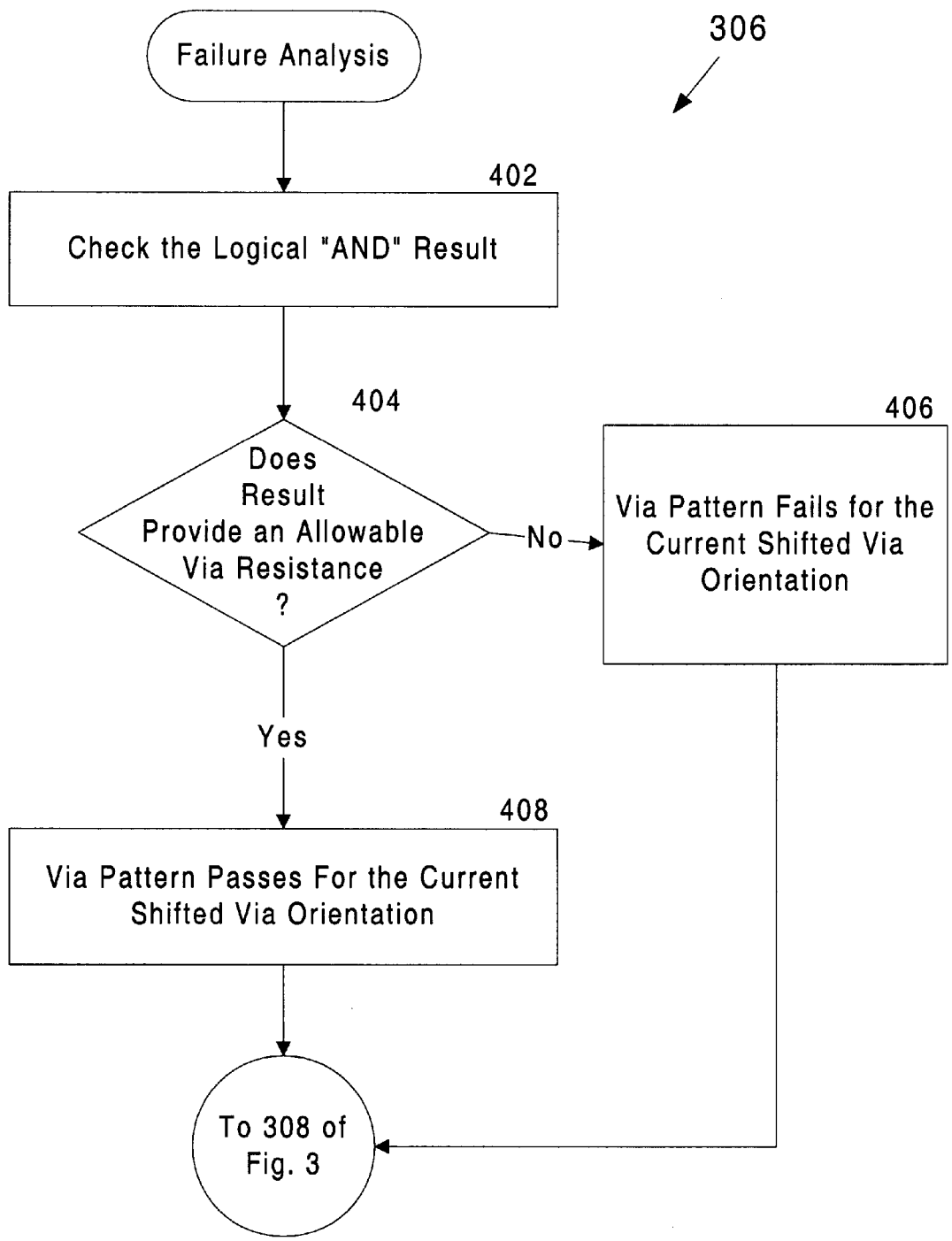
FIG. 4 is a more detailed flowchart diagram of the method operations performed within an operation of FIG. 3 in accordance with one embodiment of the present invention.

FIG. 4 is a more detailed flowchart diagram of the method operations performed within operation 306 of FIG. 3 in accordance with one embodiment of the present invention. Accordingly, the detailed flowchart of FIG. 4 represents a failure analysis performed by the DRC software in determining whether the AND result provides a sufficient overlap area as described above. The method begins at an operation 402 where the logical AND result is checked by the DRC to ascertain whether a sufficient overlap area has been produced. As mentioned above, the range of sufficient overlap area varies depending on the type of micron technology being implemented. In one example, for a 0.25 micron technology, the preferred passing overlap area produced by the logical AND result is about 50%.

The method will then proceed to a decision operation 404 where it is determined whether the result checked by the DRC in operation 402 results in an allowable via resistance. As shown in Tables A through D below, an allowable resistance for a 0.35 micron technology is about 1.3 ohms (nominal resistance), and may extend up to about 8.75 ohms (nominal resistance) in a 0.13 micron technology.

By way of example, table A below illustrates exemplary resistances that may occur for varying overlap areas in 0.35 and 0.25 micron technology designs. The numbers in parenthesis represents the resistance range that may occur in an actual physical device, and therefore, these resistances should only be viewed as exemplary in nature.

TABLE A

| Technology | Line/Via | 25% Overlap | 50% Overlap* | 100% Overlap |
| --- | --- | --- | --- | --- |
| 0.35 micron | 0.5/0.5 | 2.6Ω (8Ω) | 1.3Ω (4Ω) | 0.65Ω (2Ω) |
| 0.25 micron | 0.4/0.4 | 4.0Ω (12Ω) | 2.0Ω (6Ω) | 1.0Ω (3Ω) |

Table B illustrates exemplary resistances that may occur for varying overlap areas in a 0.18 micron technology design.

TABLE B

| Technology | Line/Via | 25% Overlap | 50% Overlap | 60%* Overlap | 100% Overlap |
| --- | --- | --- | --- | --- | --- |
| 0.18 micron | 0.3/0.3 | 7.0Ω (16Ω) | 3.5Ω (8Ω) | 2.9Ω (6Ω) | 1.75Ω (4Ω) |

Table C illustrates exemplary resistances that may occur for varying overlap areas in a 0.15 micron technology design.

TABLE C

| Technology | Line/Via | 25% Overlap | 50% Overlap | 75%* Overlap | 100% Overlap |
| --- | --- | --- | --- | --- | --- |
| 0.15 micron | 0.22/0.22 | 11.6Ω (20Ω) | 5.8Ω (10Ω) | 3.9Ω (7.5Ω) | 2.9Ω (5Ω) |

Table D illustrates exemplary resistances that may occur for varying overlap areas in a 0.13 micron technology design.

TABLE D

| Technology | Line/Via | 25% Overlap | 50% Overlap | 80%* Overlap | 100% Overlap |
| --- | --- | --- | --- | --- | --- |
| 0.13 micron | 0.15/0.15 | 28.0Ω (40Ω) | 14.0Ω (20Ω) | 8.75Ω (15Ω) | 7.0Ω (10Ω) |

Still referring to FIG. 4, if an allowable resistance does not result in operation 404, the method will proceed to an operation 406 where the via pattern for the current shifted via orientation fails and the method will proceed to the operation 308 of FIG. 3. On the other hand, if the result provides an allowable resistance, the method will proceed to an operation 408 where the via pattern is identified as passing, for the current shifted via orientation. In other words, no failure flag will be presented for the current shifted orientation, and the method will proceed to operation 308 of FIG. 3.

Figure 5A:
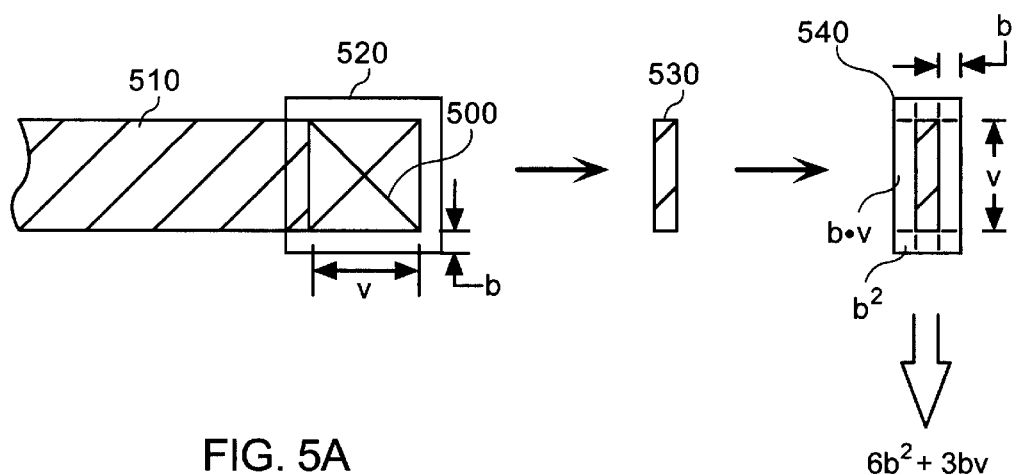
FIGS. 5A through 5E are diagrams illustrating the checking of mask layouts for possible insufficient overlap area errors using the DRC software in accordance with an alternative embodiment of the present invention.

FIGS. 5A through 5E illustrate an alternative embodiment for checking mask layouts for possible insufficient overlap area errors using DRC software in accordance with an alternative embodiment of the present invention. FIG. 5A shows an exemplary metallization geometry 510 which is in contact with a via geometry 500, but is not overlapping via geometry 500. That is, the metallization geometry 500 is not overlapping the via geometry 500 in order to simulate a possible misalignment that may occur when the feature geometries are transferred to a silicon wafer.

In this embodiment, the DRC is first required to perform a bloat operation to generate a bloat geometry 520 that expands the size of the via geometry 500 around his parameter. Once the bloat geometry 520 has been generated by the DRC, a logical AND operation is performed between the metallization geometry 510 (not including the via geometry 500), and the bloat geometry 520 to produce an AND result 530. More specifically, the operation performed to produce the AND result 530 is a value of the logical equation defined by Bloat {Via} AND {Metal AND (NOT Via)}. The AND result 530 is then subjected to a bloat operation by the DRC software to produce a final bloat geometry 540. In this example, the bloat dimension is preferably illustrated as "b," and the via dimension has a dimension "v." Therefore, the final bloat geometry 540 will encompass an area that is represented by the algebraic equation of "$6b^2+3bv$". As will be illustrated in a table 600 of FIG. 6 below, the resulting area for a case where "b" is less than "v" produces an area that falls short of a critical cut-off area that is set by a user. As will be described below, when b=v and b>v, errors occur that make distinguishing passing or failing areas difficult.

Figure 5B:
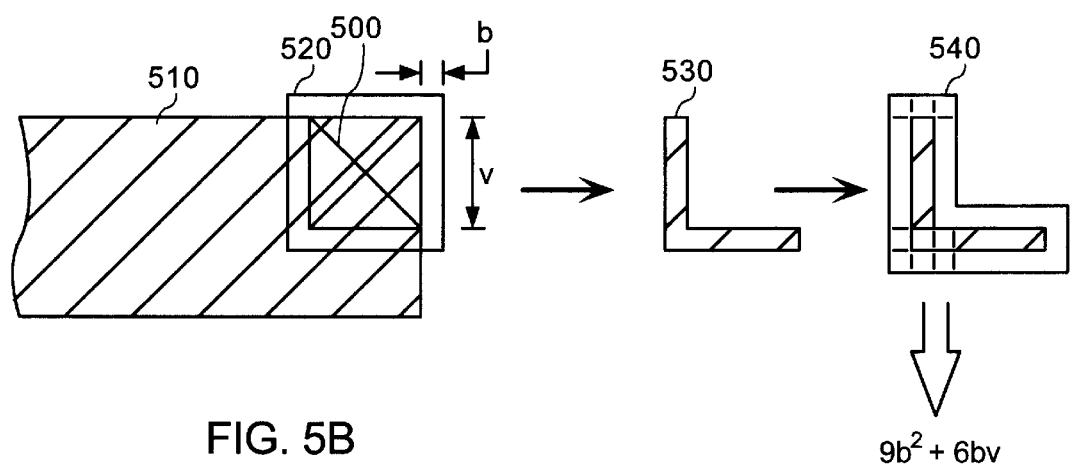

FIG. 5B illustrates another possible misaligning scenario where the metallization geometry 510 is overlapping the via geometry 500 at the upper right hand corner of the metallization geometry 510. As in the prior example, the DRC software will first perform a bloat operation on the via geometry 500 to produce a bloat geometry 520. Next, the DRC performs a logical AND operation between the metallization geometry 510 (not including the via geometry 500), and the bloat geometry 520 to produce an AND result 530. The AND result 530 is then subjected to a bloat operation to produce a final bloat geometry 540, which is represented by the algebraic equation "$9b^2+6bv$". As mentioned earlier, various exemplary scenarios for possible variables of "b" and "v" will be described below with reference to table 600 of FIG. 6.

Figure 5C:
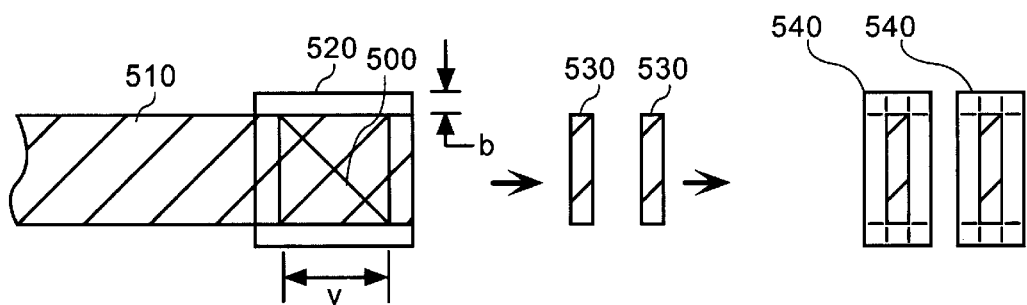

FIG. 5C illustrates another metallization geometry 510 that overlaps the via geometry 500. As in the prior examples, the via geometry 500 is first subjected to a bloat operation by the DRC to produce a bloat geometry 520. The bloat geometry 520 is then subjected to a logical AND operation with the metallization geometry 510 (not including the via geometry 500), to produce the AND result 530 in FIG. 5C. Each piece of the AND result 530 is then subjected to a bloat operation to produce a final bloat geometry having a total area expressed by the algebraic equation "$12b^2+6bv$."

Figure 5D:
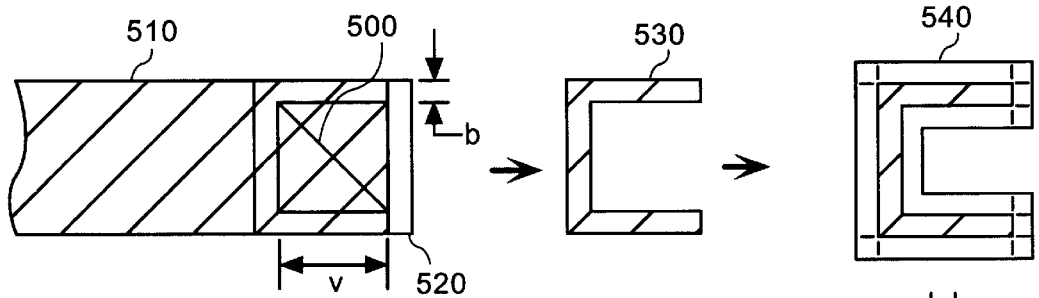

FIG. 5D illustrates a further example of a possible misalignment between a metallization geometry 510 and a via geometry 500 in accordance with one embodiment of the present invention. As in the prior examples, the via geometry 500 is first subjected to a bloat operation that produces a bloat geometry 520. The bloat geometry 520 is then subjected to a logical AND operation with the metallization geometry 510 (not including the via geometry 500), to produce an AND result 530. The AND result 530 is then subjected to another bloat operation to produce a final bloat geometry 540 having an area defined by the algebraic equation "$12b^2+9bv$".

Figure 5E:
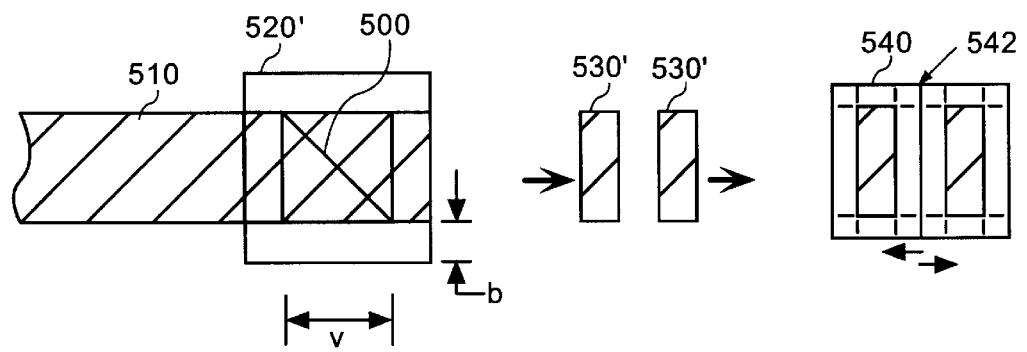

The final example shown in FIG. 5E is yet another possible misalignment that may occur between a metallization geometry 510 and a via geometry 500. In this example, a bloat operation is performed such that a bloat geometry 520' is produced where the "b" dimension has been increased to be about half of the "v" dimension. Accordingly, when a logical AND operation is performed between the metallization geometry 510 (not including the via geometry 500), and the bloat geometry 520', the AND result geometries 530' will have a larger dimension than that of the AND result geometries of FIG. 5C.

In the next operation, the DRC is preferably configured to perform a bloat operation on the AND result geometries 530 to produce bloat geometries 540. The area contained within the bloat geometries 540 is therefore expressed by the algebraic equation "$8b^2+6bv+v^2$." In the example of FIG. 5E, it should be appreciated that as the "b" dimension increases, there will be an overlap between the bloat dimensions at a point 542, such that the total area will not increase at that overlap, thereby producing an area that is limited by the above-described algebraic equation.

Figure 6:
FIG. 6 shows a table that presents exemplary dimensions for "bloats" and "vias" in accordance with one embodiment of the present invention.

FIG. 6 shows a table 600 that presents exemplary dimensions for "b" and "v" in accordance with one embodiment of the present invention. For ease of reference, each exemplary algebraic equation is shown in the left most column identified by FIGS. 5A through 5E. In the first column, "b" will be designated to be less than "v" (i.e., b<v) and exemplary micron dimensions of 0.1 microns will be used for "b" and 0.4 microns will be used for "v". Once these variables are plugged in to the algebraic equations of FIGS. 5A, 5B, 5C, 5D, and 5E, the respective areas of 0.18, 0.15, 0.36, 0.48, and 0.96 are produced.

As shown, for the exemplary misaligned geometries, there are varying areas that increase as the degree of overlapping increases. As such, the more overlap there is, a greater overlap area will be produced. When "b" is less than "v," it is possible to set a critical minimum area for the DRC software to refer to in making a decision to fail or pass a particular overlapping case. Furthermore, the critical minimum area may also be adjusted depending on the type of micron technology being inspected by the DRC software. By way of example, for a 0.25 micron technology, an approximate cutoff may be set by a designer such that areas below that derived in FIG. 5C (i.e., 0.36 microns$^2$) are designated as failing. As a result, areas produced with the equations of FIGS. 5C, 5D, and 5E may be designated as passing areas.

Reference is now drawn to the second column where "b" is equal to "v," and exemplary micron dimensions of 0.4 microns for "b" and 0.4 microns for "v" are plugged into the area equations of FIGS. 5A through 5E. In this example, when the values of "b" and "v" are plugged into the equation of FIG. 5A, an area of 1.44 microns square is produced. Likewise, when the values are plugged into the equation of FIG. 5B, an area of 2.40 microns squared is produced, and when the values are plugged into the equation of FIG. 5C, a value of 2.88 microns squared is produced. Proceeding along, when the values are plugged into the equation of FIG. 5D, a value of 3.36 microns squared is produced.

However, when the values are plugged into the equation of FIG. 5E, a value of 2.40 microns squared is produced, thereby matching the same area produced by the equation of FIG. 5B. Unfortunately, when "b" is equal to "v," the bloat dimension will be just as large as the via dimension, thereby producing substantial overlap in scenarios such as those of FIG. 5E. Accordingly, larger overlaps will no longer increase the area, and therefore make it difficult for establishing a critical cut-off area for the DRC software to follow. As such, the DRC software is preferably not well suited to be implemented for cases where b=v.

The third column also presents a problem when "b" is greater than "v" (i.e., b>v), because when the exemplary values of "b" and "v" are plugged into the respective equations of FIGS. 5A through 5E, a failing geometry may be designated for the case of FIG. 5E. However, from a visual inspection, there should have been sufficient overlap area in this case. In fact, when b>v, there may be cases such as these where a smaller area is produced for larger overlaps, and larger areas are produced for smaller overlaps. As can be appreciated, the DRC software will therefore be unable to discriminate between passing and failing overlapping areas based on a direct comparison of the overlapped area. Accordingly, the DRC software in accordance with the present invention is preferably better suited cases were "b" is less than "v".

Figure 7:
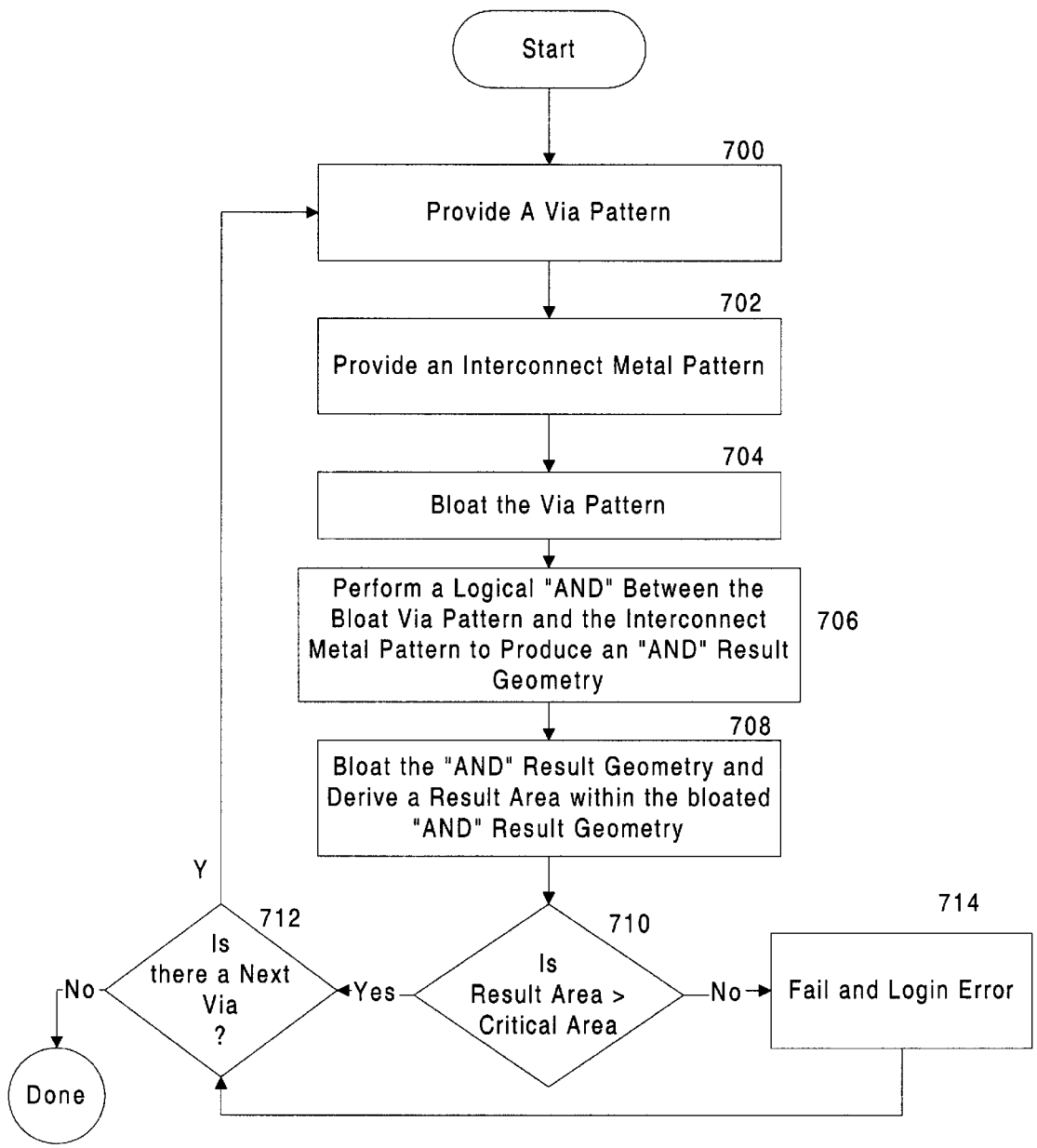
FIG. 7 is a flowchart diagram illustrating the method operations performed in accordance with the alternative embodiment of the present invention.

FIG. 7 is a flowchart diagram illustrating the method operations performed in accordance with the alternative embodiment of the present invention. The method begins at an operation 700 where a via pattern is provided from a layout mask. Once the via pattern has been provided, the method will proceed to an operation 702 where an interconnect metal pattern is provided. In one embodiment, the interconnect metal pattern may be similar in nature to that of the metallization geometries 510 of FIGS. 5A through 5E. The method will then proceed to an operation 704 where the provided via pattern is bloated to produce a bloat geometry, such as the bloat geometries 520 of FIGS. 5A through 5E.

Once the via pattern has been bloated in operation 704, the method will proceed to an operation 706 where a logical "AND" operation is performed between the bloat via pattern produced in operation 704 and the interconnect metal pattern (not including the area of the via pattern), provided in operation 702 to thereby produce an AND result geometry. Next, the method will proceed to an operation 708 where the AND result geometry is bloated to derive a result area within the bloated AND result geometry, as illustrated by the final bloat geometries 540 of FIGS. 5A through 5E. The method will then proceed to a decision operation 710 where it is determined whether the result area within the bloated AND result geometry is greater than a critical area set by the user of the DRC software.

By way of example, the user may set the DRC software to reject and fail all areas that are less than 0.36 microns$^2$ (e.g., for b=0.1 and v=0.4) as shown in FIG. 6. If the result area is greater than the critical area (i.e., a passing area), the method will proceed to decision operation 712 where the DRC software determines if there is a next via pattern to be analyzed. If there are additional vias to be analyzed, the method will proceed back up through operations 700 through 708, and then back to decision operation 710.

On the other hand, if it is determined in decision operation 710 that the result area is less than the critical area, then the method will proceed to an operation 714 where a fail and login of the error is recorded. As described above, the fail will generally identify the location of the failed overlap as well as the type of failure detected by the DRC software. The method will then proceed to decision operation 712 where it is determined whether there is a next via on the via mask to examine. If there are no more vias to examine, the method will be done. Although the above specific examples have been directed at examining overlaps between vias and metal line features, these algorithms are generally well suited to analyze any type of feature geometries.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. An exemplary structure for the invention is described below.

Figure 8:
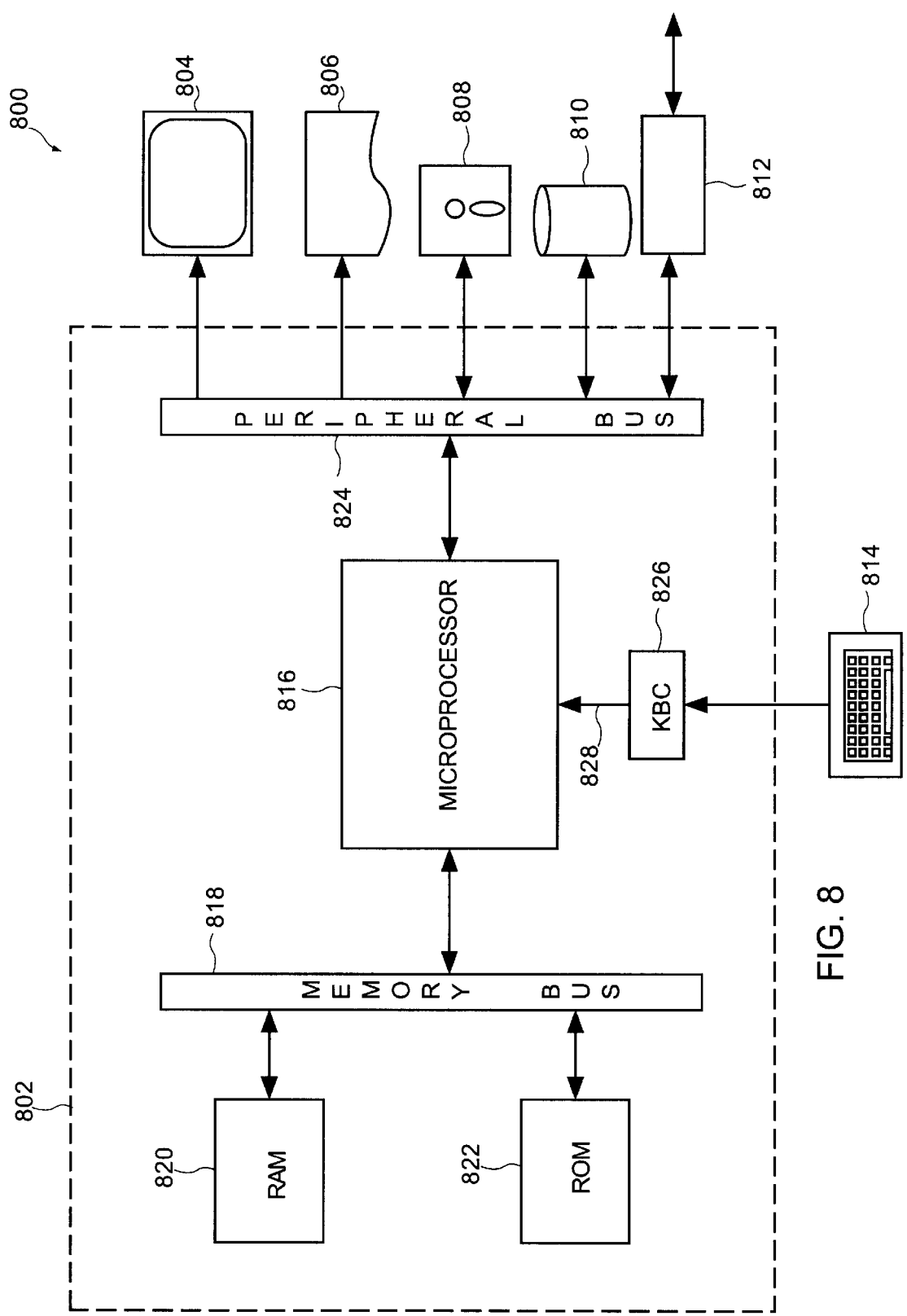
FIG. 8 is a block diagram of an exemplary computer system for carrying out the processing in accordance with one embodiment of the present invention.

FIG. 8 is a block diagram of an exemplary computer system 800 for carrying out the processing according to the invention. The computer system 800 includes a digital computer 802, a display screen (or monitor) 804, a printer 806, a floppy disk drive 808, a hard disk drive 810, a network interface 812, and a keyboard 814. The digital computer 802 includes a microprocessor 816, a memory bus 818, random access memory (RAM) 820, read only memory (ROM) 822, a peripheral bus 824, and a keyboard controller 826. The digital computer 800 can be a personal computer (such as an IBM compatible personal computer, a Macintosh computer or Macintosh compatible computer), a workstation computer (such as a Sun Microsystems or Hewlett-Packard workstation), or some other type of computer.

The microprocessor 816 is a general purpose digital processor which controls the operation of the computer system 800. The microprocessor 816 can be a single-chip processor or can be implemented with multiple components. Using instructions retrieved from memory, the microprocessor 816 controls the reception and manipulation of input data and the output and display of data on output devices. According to the invention, a particular function of microprocessor 816 is to assist in the layout checking operations.

The memory bus 818 is used by the microprocessor 816 to access the RAM 820 and the ROM 822. The RAM 820 is used by the microprocessor 816 as a general storage area and as scratch-pad memory, and can also be used to store input data and processed data. The ROM 822 can be used to store instructions or program code followed by the microprocessor 816 as well as other data.

The peripheral bus 824 is used to access the input, output, and storage devices used by the digital computer 802. In the described embodiment, these devices include the display screen 804, the printer device 806, the floppy disk drive 808, the hard disk drive 810, and the network interface 812. The keyboard controller 826 is used to receive input from keyboard 814 and send decoded symbols for each pressed key to microprocessor 816 over bus 828.

The display screen 804 is an output device that displays images of data provided by the microprocessor 816 via the peripheral bus 824 or provided by other components in the computer system 800. The printer device 806 when operating as a printer provides an image on a sheet of paper or a similar surface. Other output devices such as a plotter, typesetter, etc. can be used in place of, or in addition to, the printer device 806.

The floppy disk drive 808 and the hard disk drive 810 can be used to store various types of data. The floppy disk drive 808 facilitates transporting such data to other computer systems, and hard disk drive 810 permits fast access to large amounts of stored data.

The microprocessor 816 together with an operating system operate to execute computer code and produce and use data. The computer code and data may reside on the RAM 820, the ROM 822, or the hard disk drive 810. The computer code and data could also reside on a removable program medium and loaded or installed onto the computer system 800 when needed. Removable program mediums include, for example, CD-ROM, PC-CARD, floppy disk and magnetic tape.

The network interface 812 is used to send and receive data over a network connected to other computer systems. An interface card or similar device and appropriate software implemented by the microprocessor 816 can be used to connect the computer system 800 to an existing network and transfer data according to standard protocols.

The keyboard 814 is used by a user to input commands and other instructions to the computer system 800. Other types of user input devices can also be used in conjunction with the present invention. For example, pointing devices such as a computer mouse, a track ball, a stylus, or a tablet can be used to manipulate a pointer on a screen of a general-purpose computer.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, magnetic tape, optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for checking integrated circuit layout design files, comprising the acts of:

identifying a via geometry that is laid out on a via mask file;

identifying a metallization line geometry that is laid out on a metallization mask file;

shifting the via geometry in a first orientation to produce a first shifted via geometry such that the size of the first shifted via geometry remains the same as the via geometry;

performing a logical AND between the shifted via geometry and the metallization line geometry to produce an overlap area between the first shifted via geometry and the metallization line geometry along the first orientation; and determining whether the overlap area along the first orientation is at least about 50 percent of the first shifted via geometry.

2. A method for checking integrated circuit layout design files as recited in claim 1, wherein the overlap area of the at least about 50 percent is configured to produce a via resistance that is at least less than a maximum via resistance.

3. A method for checking integrated circuit layout design files as recited in claim 2, wherein the shifting the via geometry in the first orientation to produce the first shifted via geometry is performed through a shift operator.

4. A method for checking integrated circuit layout design files as recited in claim 3, wherein the shift operator is a checking operator of a design rule checking software package.

5. A method for checking integrated circuit layout design files as recited in claim 1, further comprising the acts of:

repeating the shifting of the via geometry in a second, a third, and a fourth orientation to produce a second shifted via geometry, a third shifted via geometry, and a fourth shifted via geometry.

6. A method for checking integrated circuit layout design files as recited in claim 5, further comprising the acts of:

performing the logical AND after each act of shifting to produce the second, the third and the fourth shifted via geometries.

7. A method for checking integrated circuit layout design files as recited in claim 6, further comprising the acts of:

determining whether the logical AND produces the value indicative of the at least about 50 percent overlap between the identified metallization line geometry and the second, the third and the fourth shifted via geometries after each of the performed logical AND operations.

8. A method for checking integrated circuit layout design files as recited in claim 3, wherein the first orientation is selected from the orientations selected from the group of a (+X, +Y) orientation, a (+X, −Y) orientation, a (−X, −Y) orientation and a (−X, +Y) orientation.

9. A method for checking integrated circuit layout design files as recited in claim 2, further comprising the act of:

performing a bloat operation on the via geometry after identifying the via geometry.

10. An apparatus for checking integrated circuit layout design files, comprising:

means for identifying a via geometry that is laid out on a via mask file;

means for identifying a metallization geometry that is laid out on a metallization mask file;

means for shifting the via geometry in a first orientation to produce a first shifted via geometry such that the size of the first shifted via geometry remains the same as the via geometry;

means for performing a logical AND between the first shifted via geometry and the metallization geometry to produce an overlap area between the first shifted via geometry and the metallization line geometry along the first orientation; and means for determining whether the overlap area along the first orientation is at least about 50 percent of the first shifted via geometry, wherein the overlap of at least about 50 percent is configured to produce a via resistance is less than a maximum via resistance.

11. An apparatus for checking integrated circuit layout design files as recited in claim 10, wherein the means for shifting the via geometry in the first orientation is performed through a shifting operator means.

12. A computer readable media containing program instructions for checking integrated circuit layout design files, the computer readable media comprising:

program instructions for identifying a via geometry that is laid out on a via mask file;

program instructions for identifying a metallization geometry that is laid out on a metallization mask file;

program instructions for shifting the via geometry in a first orientation to produce a first shifted via geometry such that the size of the first shifted via geometry remains the same as the via geometry;

program instructions for performing a logical AND between the first shifted via geometry and the metallization geometry to produce an overlap area between the first shifted via geometry and the metallization line geometry alone the first orientation; and program instructions for determining whether the overlap area along the first orientation is at least about 50 percent of the first shifted via geometry, wherein the overlap of the at least 50 percent is configured to produce a via resistance that is less than a maximum via resistance.

13. A method for checking integrated circuit layout design files as recited in claim 12, wherein the shifting the via geometry in the first orientation to produce the first shifted via geometry is performed through a shift operator.

14. A method for checking integrated circuit layout design files, comprising the acts of:

identifying a via geometry that is laid out on a via mask file;

identifying a metallization line geometry that is laid out on a metallization mask file;

shifting the via geometry in a first orientation to produce a first shifted via geometry such that the size of the first shifted via geometry remains the same as the via geometry;

producing an overlap area between the first shifted via geometry and the metallization line geometry along the first orientation; and determining whether the overlap area along the first orientation is at least about 50 percent of the first shifted via geometry.

15. The method for checking integrated circuit layout design files as recited in claim 14, wherein the overlap area between the first shifted via geometry and the metallization line geometry is produced by performing a logical AND between the shifted via geometry and the metallization line geometry.

16. A method for checking integrated circuit layout design files as recited in claim 14, wherein the overlap area of the at least about 50 percent is configured to produce a via resistance that is at least less than a maximum via resistance.

17. A method for checking integrated circuit layout design files as recited in claim 14, wherein the shifting the via geometry in the first orientation to produce the first shifted via geometry is performed through a shift operator.

18. A method for checking integrated circuit layout design files as recited in claim 14, further comprising the acts of:

repeating the shifting of the via geometry in a second, a third, and a fourth orientation to produce a second shifted via geometry, a third shifted via geometry, and a fourth shifted via geometry.

19. A method for checking integrated circuit layout design files as recited in claim 14, wherein the overlap area is at least about 50 percent of the first shifted via geometry.

20. A method for checking integrated circuit layout design files as recited in claim 14, further comprising the acts of:

repeating the shifting of the via geometry in a second, a third, and a fourth orientation to produce a second shifted via geometry, a third shifted via geometry, and a fourth shifted via geometry.

21. A method for checking integrated circuit layout design files, comprising the acts of:

identifying a via geometry that is laid out on a via mask file;

identifying a metallization line geometry that is laid out on a metallization mask file;

shifting the via geometry in a first orientation to produce a first shifted via geometry such that the size of the first shifted via geometry remains the same as the via geometry;

producing an overlap area between the first shifted via geometry and the metallization line geometry along the first orientation; and determining whether the overlap area along the first orientation is sufficient to produce a via resistance that is at least less than a maximum via resistance.

22. The method for checking integrated circuit layout design files as recited in claim 21, wherein the overlap area between the first shifted via geometry and the metallization line geometry is produced by performing a logical AND between the shifted via geometry and the metallization line geometry.

* * * * *